(12) United States Patent
Tang et al.

(10) Patent No.: US 8,134,205 B2
(45) Date of Patent: Mar. 13, 2012

(54) LAYOUT STRUCTURE OF POWER MOS TRANSISTOR

(75) Inventors: Ming Tang, Hsinchu (TW); Shih-Ping Chiao, Hsinchu (TW)

(73) Assignee: PTEK Technology Co., Ltd., Hsinchu (TW)

( * ) Notice: Subject to any disclaimer, the term of this patent is extended or adjusted under 35 U.S.C. 154(b) by 124 days.

(21) Appl. No.: 12/683,053

(22) Filed: Jan. 6, 2010

(65) Prior Publication Data

US 2011/0163378 A1 Jul. 7, 2011

(51) Int. Cl.
*H01L 29/66* (2006.01)
*H01L 21/336* (2006.01)
(52) U.S. Cl. . 257/341; 257/390; 257/401; 257/E21.177; 438/197
(58) Field of Classification Search .......... None
See application file for complete search history.

(56) References Cited

U.S. PATENT DOCUMENTS

| 5,136,349 | A | * | 8/1992 | Yilmaz et al. | 257/339 |
| 5,689,129 | A | * | 11/1997 | Pearce | 257/341 |
| 5,852,315 | A | * | 12/1998 | Ker et al. | 257/355 |
| 5,872,377 | A | * | 2/1999 | Jeon | 257/341 |
| 6,140,687 | A | * | 10/2000 | Shimomura et al. | 257/401 |
| 2008/0135934 | A1 | * | 6/2008 | Liu | 257/343 |
| 2009/0250751 | A1 | * | 10/2009 | Sutardja et al. | 257/335 |

\* cited by examiner

*Primary Examiner* — Alonzo Chambliss
(74) *Attorney, Agent, or Firm* — WPAT, P.C.; Anthony King

(57) ABSTRACT

The present invention discloses a layout structure of a transistor unit of a power MOS transistor, wherein the layout structure comprises a drain area, a plurality of body areas, a plurality of source areas and a gate area. The plurality of body areas surround the drain area. The plurality of source areas extend from the perimeters of the plurality of body areas in an anisotropic manner. The gate area is disposed between the drain area and the plurality of source areas. The contacts of the drain area, the plurality of body areas and the plurality of source areas are all disposed on the same side of the layout structure.

16 Claims, 4 Drawing Sheets

LAYOUT STRUCTURE OF POWER MOS TRANSISTOR

BACKGROUND OF THE INVENTION

1. Field of the Invention

The present invention relates to a layout structure of a MOS transistor, and more particularly, to a layout structure of a power MOS transistor.

2. Description of the Related Art

A power MOS transistor is a particular kind of MOS transistor that is used as a dedicated component providing and switching power to integrated circuits. Accordingly, power MOS transistors require the capability to operate under high voltage. Typical power MOS transistors manufactured by CMOS process are of large size so as to be able to operate under high voltage. In addition, power MOS transistors also require the capability to provide a large output current. Therefore, in a typical manufacturing process, a power MOS transistor is composed of thousands to hundreds of thousands of transistor units, wherein each transistor unit can provide a small amount of output current. As a result, the power MOS transistor can provide a large output current.

FIG. 1 shows a conventional layout structure of a power MOS transistor. As shown in FIG. 1, the power MOS transistor 100 comprises a transistor unit 110. The transistor unit 110 comprises a source area 120, a gate area 130, a drain area 140 and a body area 150. Both the drain area 140 and the body area 150 exhibit a rectangular layout structure. The source area 120 surrounds the body area 150 to constitute an enlarged rectangular layout structure. The gate area 130 separates the drain area 140 and the source area 120.

As mentioned, a conventional power MOS transistor comprises thousands to hundreds of thousands of transistor units. Accordingly, the layout structure of the power MOS transistor 100 comprises a plurality of transistor units disposed side by side in a tight arrangement, wherein the layout structure of each transistor unit is the same as the layout structure of the transistor unit 110. Constrained by its layout structure property, the transistor unit 110 can only provide a limited amount of current. Therefore, to provide a large amount of current, a conventional power MOS transistor requires a huge amount of transistor units, resulting in greatly increased manufacturing cost.

Therefore, there is a need to design a layout structure of a power MOS transistor such that the transistor unit therein can provide a high current, and thus the power MOS transistor can provide a higher current than conventional power MOS transistors, and as a result, the manufacturing costs are reduced.

SUMMARY OF THE INVENTION

The present invention discloses a layout structure of transistor unit of a power MOS transistor, wherein the perimeter of the source area of the transistor unit is increased, and therefore the output current is increased.

The power MOS transistor according to one embodiment of the present invention comprises at least a transistor unit. The layout structure of the transistor unit comprises a drain area, a plurality of body areas, a plurality of source areas and a gate area. The plurality of body areas surrounds the drain area. The plurality of source areas extend outward from the perimeter of each of the plurality of body areas in an anisotropic manner. The gate area is disposed between the drain area and the plurality of source areas, having at least three conductive lines connecting two adjacent gate areas. The contacts of the drain area, the plurality of body areas and the plurality of source areas are disposed on the same side of the layout structure, and the transistor unit comprises spatial symmetry with respect to the center of the transistor unit.

The power MOS transistor according to another embodiment of the present invention comprises at least a transistor unit. The layout structure of the transistor unit comprises a drain area, a plurality of body areas, a plurality of source areas and a gate area. The plurality of body areas surrounds the drain area. The plurality of source areas extends outward from each side of each of the plurality of body areas. The gate area is disposed between the drain area and the plurality of source areas, and the layout structure has at least three conductive lines connecting adjacent gate areas. The contacts of the drain area, the plurality of body areas and the plurality of source areas are disposed on the same side of the layout structure, and the transistor unit comprises spatial symmetry with respect to the center of the transistor unit.

BRIEF DESCRIPTION OF THE DRAWINGS

The objectives and advantages of the present invention will become apparent upon reading the following description and upon referring to the accompanying drawings of which.

DETAILED DESCRIPTION OF THE INVENTION

Figure 2:
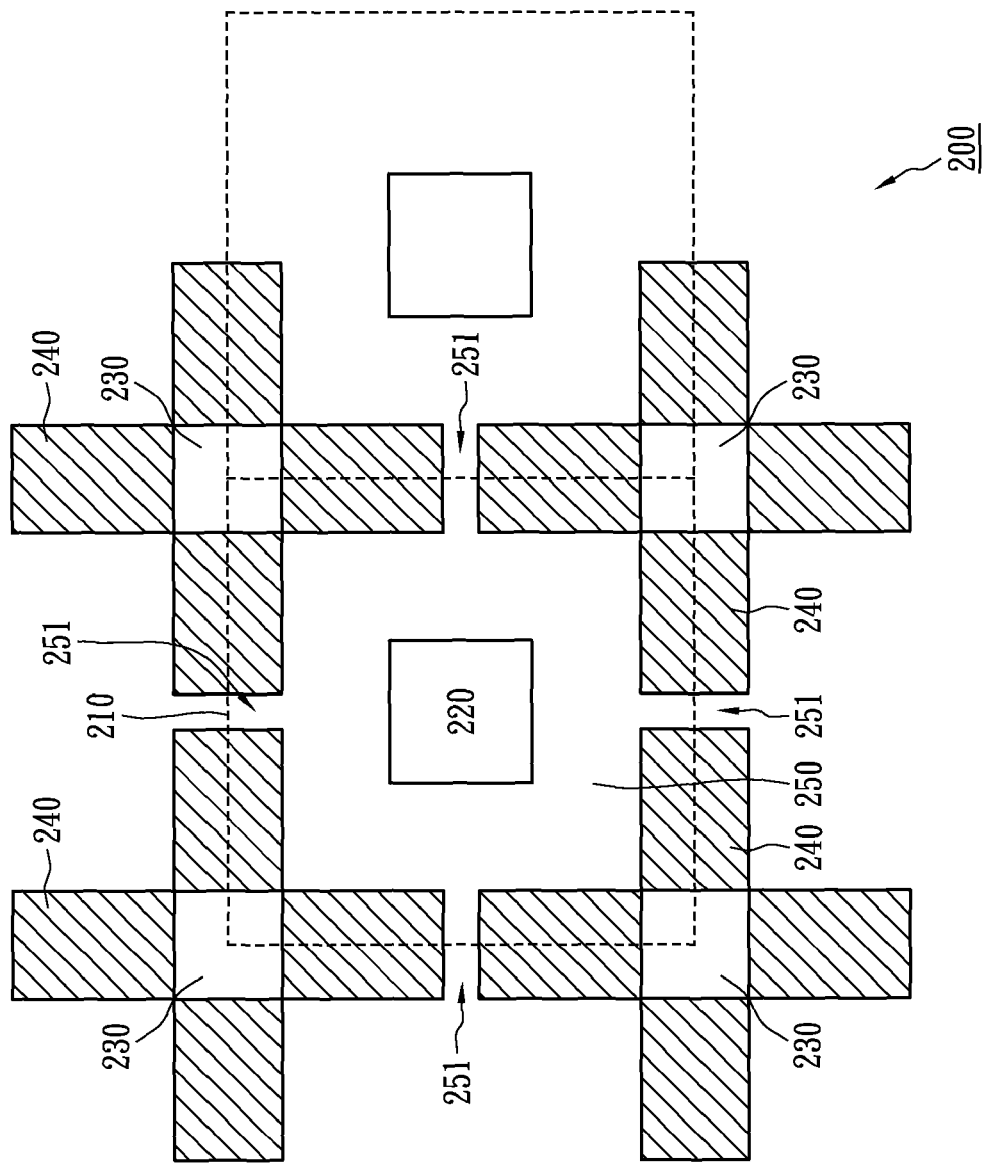
FIG. 2 shows a schematic view of a layout structure of a power MOS transistor according to one embodiment of the present invention.

FIG. 2 shows a schematic view of a layout structure of a power MOS transistor according to one embodiment of the present invention. As shown in FIG. 2, the power MOS transistor 200 comprises a transistor unit 210. The transistor unit 210 comprises a drain area 220, a plurality of body areas 230, a plurality of source areas 240 and a gate area 250. The plurality of body areas 230 surrounds the drain area 220. The plurality of source areas 240 extends outward from the perimeter of each of the plurality of body areas 230 in an anisotropic manner. The gate area 250 is disposed between the drain area 220 and the plurality of source areas 240, and the layout structure has four conductive lines 251 connecting adjacent gate areas. The transistor unit 210 comprises spatial symmetry with respect to the center of the transistor unit 210.

As shown in FIG. 2, each body area 230 and the source areas 240 extending outward from the perimeter of the body area 230 in an anisotropic manner constitute a cross structure. Therefore, comparing the transistor unit 210 with the transistor unit 110 shown in FIG. 1, under the same area, the sum of the perimeters of the plurality of source areas 240 of the transistor unit 210 is greater than the perimeter of the source area 120 of the transistor unit 110.

According to a well-known formula:

$$Ids = \frac{W}{L}C\mu(Vg - Vt - 0.5Vds)Vds,$$

wherein W is the perimeter of a source area and $I_{ds}$ is the current provided by a transistor unit, it can be seen that the current $I_{ds}$ is proportional to the source area perimeter W. Therefore, since the transistor unit 210 exhibits a greater source area perimeter W, it can provide a higher current $I_{ds}$ than the transistor unit 110 shown in FIG. 1.

Figure 1:
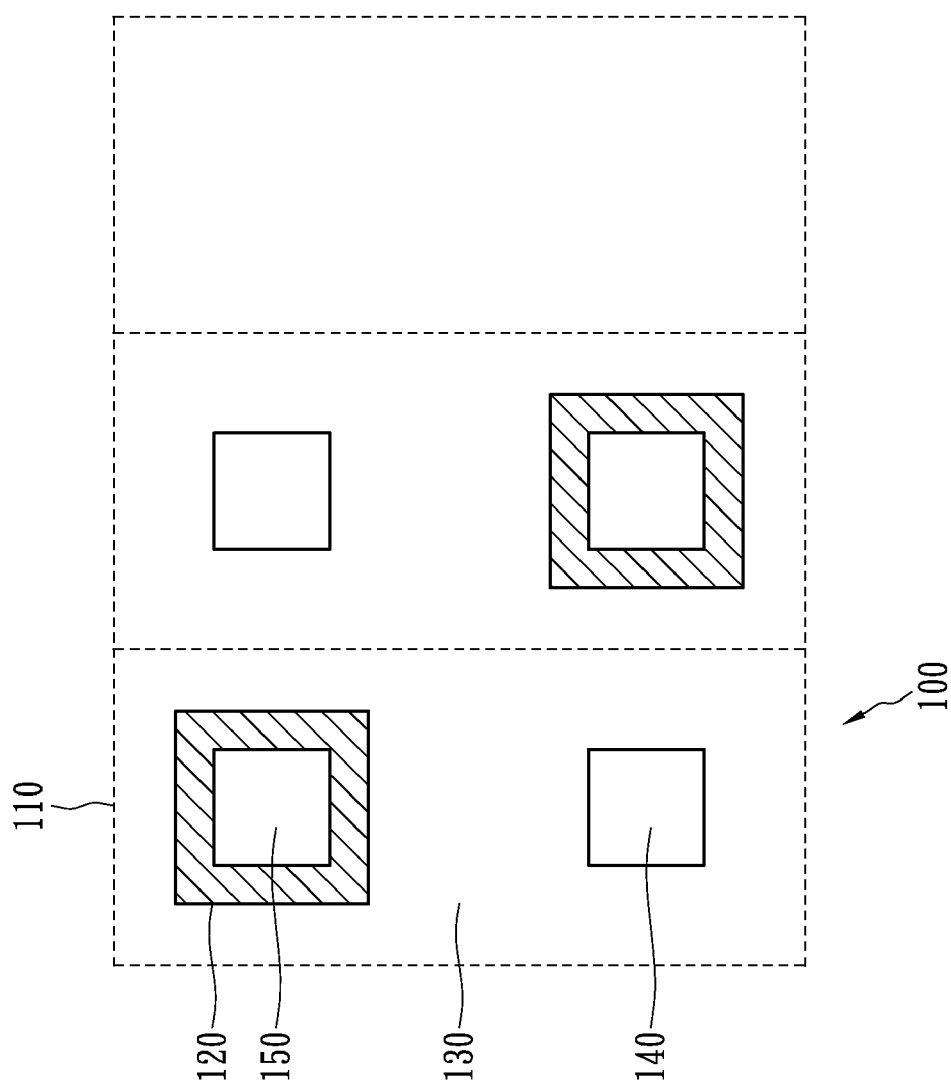
FIG. 1 shows a conventional layout structure of a power MOS transistor.
Figure 3:
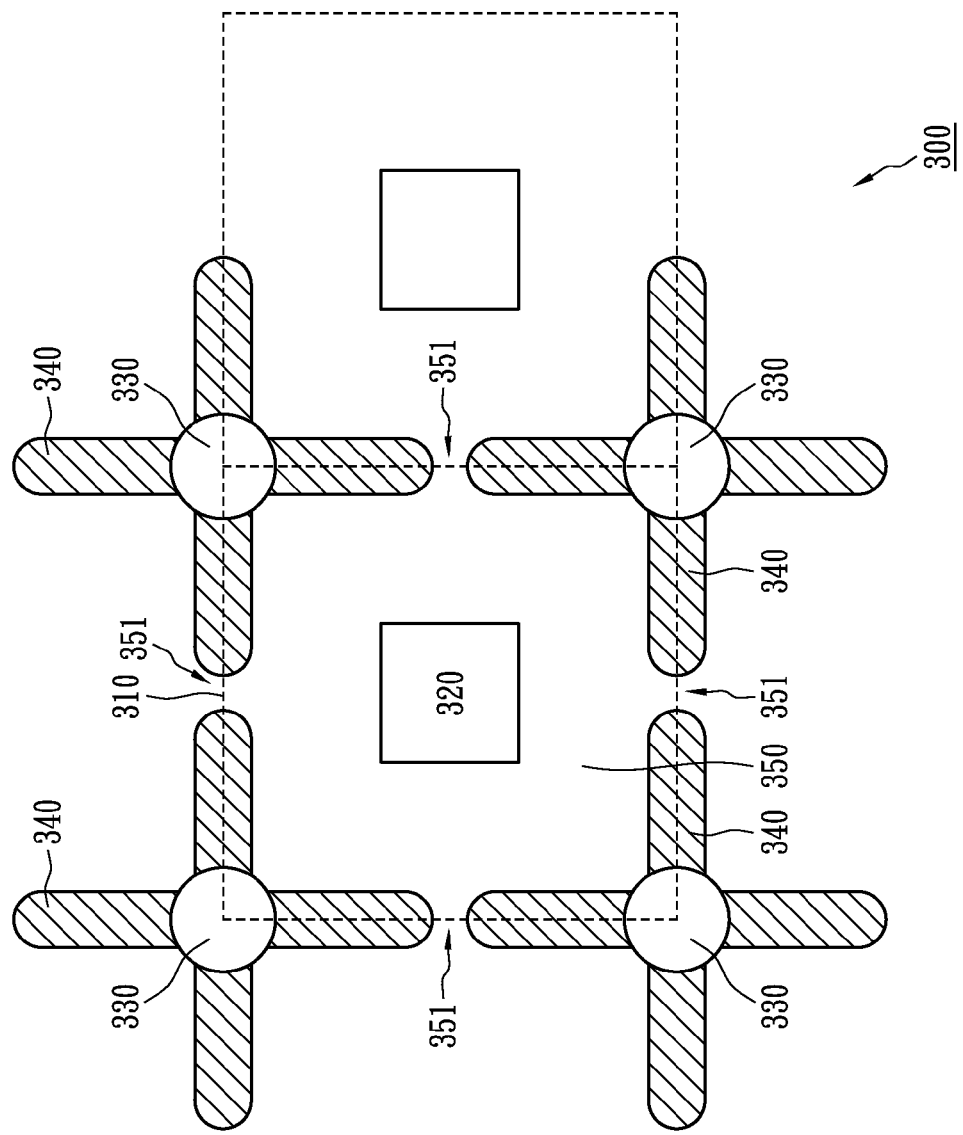
FIG. 3 shows a schematic view of a layout structure of a power MOS transistor according to another embodiment of the present invention.

The layout structure of a power MOS transistor provided by the present invention is not limited to the cross structure shown in FIG. 1, but should cover all of the layout structures in which the source areas extend outward from the perimeters of the body areas in an anisotropic manner. FIG. 3 shows a schematic view of a layout structure of a power MOS transistor according to another embodiment of the present invention. As shown in FIG. 3, the power MOS transistor 300 comprises a transistor unit 310. The transistor unit 310 comprises a drain area 320, a plurality of body areas 330, a plurality of source areas 340 and a gate area 350. The plurality of body areas 330 surround the drain area 320. The plurality of source areas 340 extend outward from perimeter of each of the plurality of body areas 330 in an anisotropic manner. The gate area 350 is disposed between the drain area 320 and the plurality of source areas 340, and the layout structure has four conductive lines 351 connecting two adjacent gate areas. The transistor unit 310 comprises spatial symmetry with respect to the center of the transistor unit 310.

Even though the layout structure of the transistor unit 310 is different from that of the transistor unit 210 shown in FIG. 2, they both achieve similar results. As shown in FIG. 3, the layout structure of the transistor unit 310 is circular, and each body area 330 is partially surrounded by the plurality of source areas 340 extending outward from the perimeter of the body area 330 in an anisotropic manner.

Figure 4:
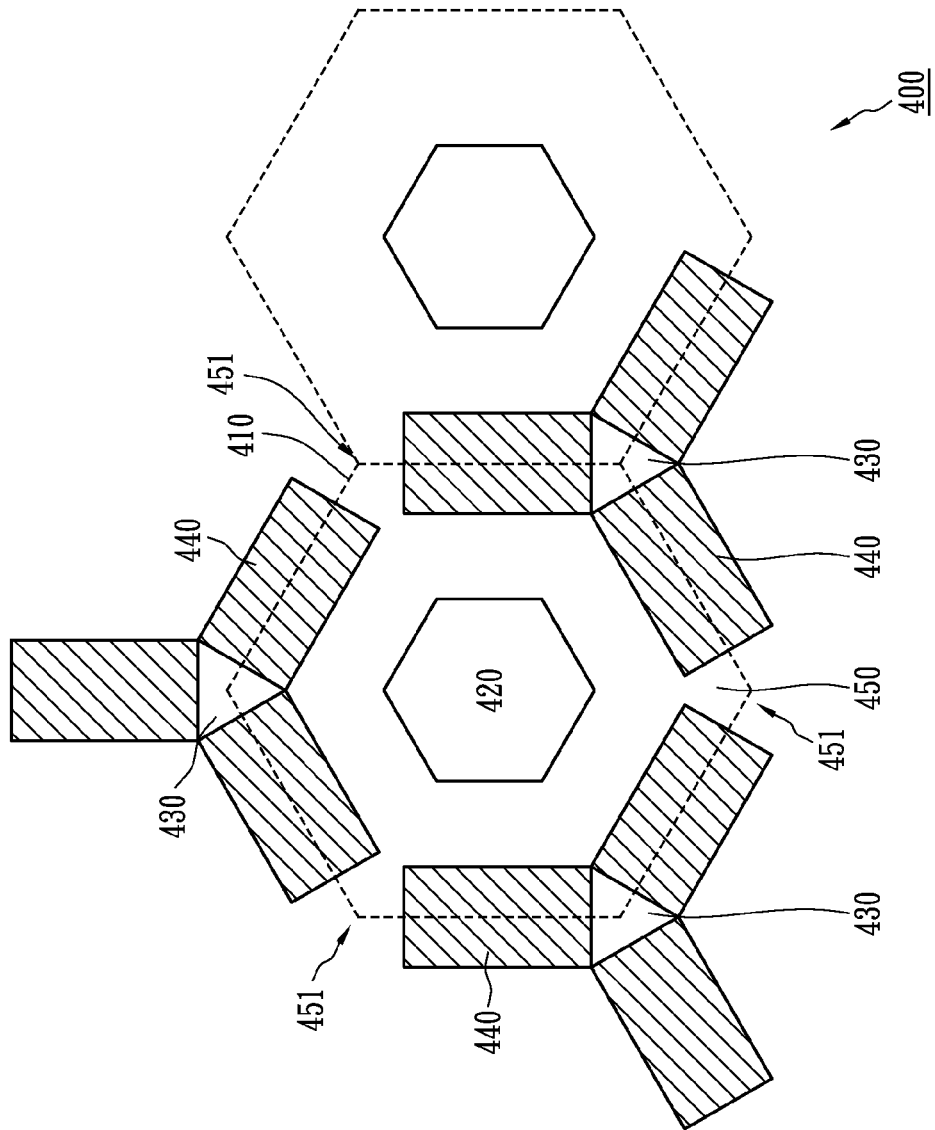
FIG. 4 shows a schematic view of a layout structure of a power MOS transistor according to yet another embodiment of the present invention.

FIG. 4 shows a schematic view of a layout structure of a power MOS transistor according to yet another embodiment of the present invention. As shown in FIG. 4, the power MOS transistor 400 comprises a transistor unit 410. The transistor unit 410 comprises a drain area 420, a plurality of body areas 430, a plurality of source areas 440 and a gate area 450. The plurality of body areas 430 surround the drain area 420. The plurality of source areas 440 extend outward from the perimeter of each of the plurality of body areas 430 in an anisotropic manner. The gate area 450 is disposed between the drain area 320 and the plurality of source areas 440, and the layout structure has three conductive lines 451 connecting two adjacent gate areas. The transistor unit 410 comprises spatial symmetry with respect to the center of the transistor unit 410.

Even though the layout structure of the transistor unit 410 is different from those of the transistor unit 210 shown in FIG. 2 and the transistor unit 310 shown in FIG. 3, they all achieve similar results. As shown in FIG. 4, the layout structure of the transistor unit 410 is hexagonal, and the number of the plurality of source areas 440 extending outward from the perimeter of each of the plurality of body areas 430 in an anisotropic manner is three. The adjacent source areas 440 extending from the same body area 430 has an included angle of substantially 120 degrees, that is, the outward-reaching source region 440 extending from one side of the triangular body area 430 is arranged to have an angle of essentially 120 degrees between itself and any of the adjacent source areas.

The term "anisotropic" means that the degrees of the outward extensions are not equal and comprises the case that the lengths of the source areas extending outward from a body area are not equal and the case that the body area is not completely surrounded by the source areas extending outward from the perimeter of the body area.

In conclusion, the layout structures of a power MOS transistor according to the embodiments of the present invention increase the perimeters of the source areas of a transistor unit such that a higher output current can be provided. Compared with a conventional power MOS transistor, the power MOS transistor according to the embodiments of the present invention can provides a higher output current under the same circuit area. Therefore, the power MOS transistor according to the embodiments of the present invention can provide the same output current as a conventional power MOS transistor with a smaller circuit area. As a result, the manufacturing costs are reduced.

The above-described embodiments of the present invention are intended to be illustrative only. Those skilled in the art may devise numerous alternative embodiments without departing from the scope of the following claims.

What is claimed is:

1. A power MOS transistor comprising a plurality of transistor units, a layout structure of the transistor unit comprising:
   a drain area;
   a plurality of body areas surrounding the drain area;
   a plurality of source areas extending outward from the perimeter of each of the plurality of body areas in an anisotropic manner;
   a gate area disposed between the drain area and the plurality of source areas; and
   at least three conductive lines connecting adjacent gate areas;
   wherein contacts of the drain area, the plurality of body areas and the plurality of source areas are disposed on the same side of the layout structure, and the transistor unit comprises spatial symmetry with respect to the center of the transistor unit.

2. The power MOS transistor of claim 1, wherein the number of the plurality of source areas extending outward from the perimeter of each of the plurality of body areas in an anisotropic manner is four.

3. The power MOS transistor of claim 1, wherein the number of the plurality of source areas extending outward from the perimeter of each of the plurality of body areas in an anisotropic manner is three, and the adjacent source areas extending from the same body area has an included angle of substantially 120 degrees.

4. The power MOS transistor of claim 1, wherein the layout structure of the transistor unit is rectangular.

5. The power MOS transistor of claim 1, wherein the layout structure of the transistor unit is hexagonal.

6. The power MOS transistor of claim 1, wherein each body area is completely surrounded by the plurality of source areas.

7. The power MOS transistor of claim 1, wherein each body area is partially surrounded by the plurality of source areas.

8. The power MOS transistor of claim 1, wherein each body area and the source areas extending outward from the perimeter of the body area in an anisotropic manner constitute a cross structure.

9. A power MOS transistor comprising a plurality of transistor units, a layout structure of the transistor unit comprising:
   a drain area;
   a plurality of body areas surrounding the drain area;
   a plurality of source areas extending outward from each side of each of the plurality of body areas;
   a gate area disposed between the drain area and the plurality of source areas; and
   at least three conductive lines connecting adjacent gate areas;

wherein contacts of the drain area, the plurality of body areas and the plurality of source areas are disposed on the same side of the layout structure, and the transistor unit comprises spatial symmetry with respect to the center of the transistor unit.

10. The power MOS transistor of claim 9, wherein the number of the plurality of source areas extending outward from each side of each of the plurality of body areas is four.

11. The power MOS transistor of claim 9, wherein the number of the plurality of source areas extending outward from each side of each of the plurality of body areas is three, and the adjacent source areas extending from the same body area has an included angle of substantially 120 degrees.

12. The power MOS transistor of claim 9, wherein the layout structure of the transistor unit is rectangular.

13. The power MOS transistor of claim 9, wherein the layout structure of the transistor unit is hexagonal.

14. The power MOS transistor of claim 9, wherein each body area is completely surrounded by the plurality of source areas.

15. The power MOS transistor of claim 9, wherein each body area is partially surrounded by the plurality of source areas.

16. The power MOS transistor of claim 9, wherein each body area and the source areas extending outward from each side of the body area constitute a cross structure.

* * * * *